United States Patent
Smith

(10) Patent No.: US 9,733,566 B2
(45) Date of Patent: Aug. 15, 2017

(54) SPIN-ON LAYER FOR DIRECTED SELF ASSEMBLY WITH TUNABLE NEUTRALITY

(71) Applicant: Tokyo Electron Limited, Minato-ku, Tokyo (JP)

(72) Inventor: Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/068,833

(22) Filed: Mar. 14, 2016

(65) Prior Publication Data

US 2016/0276149 A1   Sep. 22, 2016

Related U.S. Application Data

(60) Provisional application No. 62/134,149, filed on Mar. 17, 2015.

(51) Int. Cl.
   *G03F 7/11* (2006.01)
   *G03F 7/16* (2006.01)
   (Continued)

(52) U.S. Cl.
   CPC ............ *G03F 7/11* (2013.01); *B82Y 30/00* (2013.01); *C08L 53/00* (2013.01); *C09D 153/00* (2013.01);
   (Continued)

(58) Field of Classification Search
   CPC .......... G03F 7/004; G03F 7/11; G03F 7/0002; G03F 7/165; G03F 7/26; G03F 7/265;
   (Continued)

(56) References Cited

U.S. PATENT DOCUMENTS

| | | | |
|---|---|---|---|
| 9,120,947 B2* | 9/2015 | Willson | B81C 1/00031 |
| 2004/0175628 A1* | 9/2004 | Nealey | B82Y 30/00 |
| | | | 430/1 |

(Continued)

FOREIGN PATENT DOCUMENTS

| | | |
|---|---|---|
| JP | 2008036491 | 2/2008 |
| JP | 2014-209514 | 11/2014 |

(Continued)

OTHER PUBLICATIONS

International Patent Application No. PCT/US2016/022450, "International Search Report and Written Opinion," International Filing Date Mar. 15, 2016, International Search Report and Written Opinion dated May 30, 2016.

*Primary Examiner* — Amanda C Walke

(57) ABSTRACT

Techniques disclosed herein include methods for creating a directed self-assembly tunable neutral layer that works with multiple different block copolymer materials. Techniques herein can include depositing a neutral layer and then post-processing this neutral layer to tune its characteristics so that the neutral layer is compatible with a particular block copolymer scheme or schemes. Post-processing herein of such a neutral layer can modify a ratio of pi and sigma bonds in a given carbon film or other film to approximate a given self-assembly film that will be deposited on this neutral layer. Accordingly, a generic or single material can be used for a neutral layer and modified to match a given block copolymer to be deposited.

18 Claims, 2 Drawing Sheets

(51) Int. Cl.
*G03F 7/20* (2006.01)
*G03F 7/004* (2006.01)
*G03F 7/40* (2006.01)
*G03F 7/00* (2006.01)
*G03F 7/26* (2006.01)
*C09D 153/00* (2006.01)
*H01L 21/033* (2006.01)
*H01L 21/308* (2006.01)
*C08L 53/00* (2006.01)
*B82Y 30/00* (2011.01)
*H01L 21/027* (2006.01)
*H01L 21/3105* (2006.01)

(52) U.S. Cl.
CPC .............. *G03F 7/002* (2013.01); *G03F 7/004* (2013.01); *G03F 7/16* (2013.01); *G03F 7/165* (2013.01); *G03F 7/2059* (2013.01); *G03F 7/26* (2013.01); *G03F 7/265* (2013.01); *G03F 7/40* (2013.01); *H01L 21/0271* (2013.01); *H01L 21/0337* (2013.01); *H01L 21/3081* (2013.01); *H01L 21/3086* (2013.01); *H01L 21/31058* (2013.01); *B81C 2201/0149* (2013.01)

(58) Field of Classification Search
CPC ... G03F 7/40; C08L 53/00; B81C 2201/0149; B82Y 30/00; C09D 153/00; H01L 21/0337; H01L 21/3086; H01L 21/3081

USPC ............ 430/322, 271.1, 325, 329, 330, 331; 525/299, 280

See application file for complete search history.

(56) References Cited

U.S. PATENT DOCUMENTS

| | | |
|---|---|---|
| 2008/0311347 A1 | 12/2008 | Millward et al. |
| 2009/0035668 A1 | 2/2009 | Breyta et al. |
| 2009/0179001 A1* | 7/2009 | Cheng ...................... B05D 5/00 216/41 |
| 2009/0179002 A1* | 7/2009 | Cheng .................... B82Y 10/00 216/41 |
| 2013/0078576 A1 | 3/2013 | Wu et al. |
| 2014/0060736 A1* | 3/2014 | Millward ............ B81C 1/00031 156/345.3 |
| 2014/0197133 A1 | 7/2014 | Montarnal et al. |
| 2014/0299969 A1 | 10/2014 | Xu et al. |
| 2015/0380266 A1* | 12/2015 | Wuister ................ G03F 7/0002 257/622 |
| 2016/0104628 A1* | 4/2016 | Metz ................... H01L 21/3086 438/703 |

FOREIGN PATENT DOCUMENTS

| | | |
|---|---|---|
| JP | 2015-004745 | 1/2015 |
| WO | 2013158527 | 10/2013 |

* cited by examiner

SPIN-ON LAYER FOR DIRECTED SELF ASSEMBLY WITH TUNABLE NEUTRALITY

CROSS REFERENCE TO RELATED APPLICATIONS

The present application claims the benefit of U.S. Provisional Patent Application No. 62/134,149, filed on Mar. 17, 2015, entitled "Spin-On Under Layer for Directed Self Assembly with Tunable Neutrality," which is incorporated herein by reference in its entirety.

BACKGROUND OF THE INVENTION

Techniques herein relate to methods of fabricating semiconductors including methods for patterning substrates.

Fabricating semiconductors includes patterning a wafer surface to be able to create various trenches, holes, and openings in underlying layers. Currently there are challenges with using lithographic tools to create patterns having critical dimensions to meet design specifications. In other words, due to the resolution limitations of patterning photoresists, patterns developed from photoresists do not have lines, trenches, and holes that are sufficiently small to meet design specifications. One technique to shrink patterns to desired dimensions is known as directed self-assembly (DSA).

Directed Self-Assembly (DSA) is a block copolymer process that uses a manufactured polymer that consists of two blocks that are connected. With proper activation, the two (or more) block copolymers will micro phase separate into individual blocks. Conceptually this is similar to how oil can be attached to water via soap. Typically oil and water to not mix but can be held together with certain binding chemicals, but with these binding chemicals removed, oil and water will separate. Likewise, two different blocks in a block copolymer mixture will repel each other, while other blocks can be attracted to themselves. Activation is typically executed via heat energy which causes block copolymer separation on a nanoscale based on various polymer parameters. This phase separation causes nanometer-sized structures to be formed. Typically this is an alternating or repeating pattern of structures being formed. For example, alternating lines of block copolymer can be formed or assembled. Also, one block copolymer can form cylinders while the second block copolymer forms around the cylinders. Using DSA, cylindrical structures can be created based on Kai the Flory interaction parameter and N—the statistical molecular weight and the volume. When DSA is coupled with a photoresist pattern (or other pattern) sub-resolution structures can be formed. This is possible because multiple lines or cylinders can be formed within feature dimensions defined by a photoresist pattern. Accordingly, patterned dimensions provided by a photoresist pattern can be shrunk to various design specifications.

SUMMARY

Directed self-assembly (DSA) of block copolymers is a process using a block co-polymer or block tri-polymer system in which there is a measurable interaction parameter which causes repulsion between the distinct blocks. The composition of the various blocks within the co-polymer or tri-polymer will yield differing morphologies, or shapes, usually expressed as lamellae for patterning line/space, and cylinders for patterning contacts or pillars. These morphologies can exist in either a parallel (horizontally oriented layers) or perpendicular form (vertically oriented shapes), with the perpendicular form being conventionally desired for patterning applications. Assembly of the parallel or perpendicular form is dependent upon the surface energy and material composition of the films under the block co-polymer and the environment at the surface of the block co-polymer. Typically spin-on or CVD-deposited neutral layers are placed under the block co-polymer to produce a wetting angle preferred by the perpendicular morphologies. In either a wet or dry develop step, one component of the block co-polymer can be selectively removed to yield a definitive pattern which can then be transferred (etched) into an underlying substrate.

One challenge with spin-on neutral layers is that they are typically specifically tuned to a fixed DSA chemistry in terms of composition of the individual blocks, the relative percent of one block to another, and the overall molecular weight of the block co-polymer. Thus, to enable using multiple block co-polymer chemistries on a lithography or patterning tool (such as a coater/developer), multiple specific neutral layers must also be similarly deployed on the equipment. In other words, dozens of different materials need to be available for deposition to match with any one of dozens or more of block copolymer mixtures.

Techniques herein, however, provide an in-situ method for tuning (modifying or creating) a neutrality value of layers or materials on a substrate, which better enables efficient, directed self-assembly. For example, a PMMA-type (polymethyl methacrylate) polymer system can be used with an in-situ method to generate cross-linking or another chemical reaction/change of the polymer system that produces a quantified measure of carbon-carbon sigma and pi bonds. Polymer material can thus be modified to possess a surface energy preferential to the morphology of a particular block co-polymer system selected for subsequent use. Polymer material can be modified so that a composition of the neutral film contains similar sigma/pi bonds as compared to that of a given block co-polymer system, such as to generate desired morphologies from self-assembly.

One example embodiment includes a method for patterning a substrate. A tunable layer is deposited on a substrate. The tunable layer is an organic material having a first ratio of sigma bonds to pi bonds. A mixture ratio of a first block copolymer to a second block copolymer is identified that corresponds to a block copolymer mixture specified for deposition on the substrate, The tunable layer is modified—to result in a neutral layer—by increasing the first ratio of sigma bonds to pi bonds to a second ratio of sigma bonds to pi bonds. This second ratio of sigma bonds to pi bonds has a value that is approximately equivalent to the mixture ratio of the first block copolymer to the second block copolymer. The block copolymer mixture is deposited on the substrate. Phase-separation of the block copolymer mixture is initiated such that self-assembly of the block copolymer mixture occurs.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below,

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
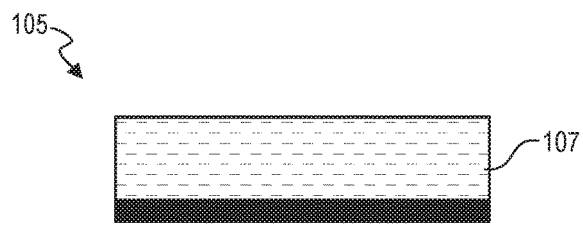
FIG. 1 is a cross-sectional schematic view of an example substrate segment showing a process flow according to embodiments disclosed herein.

Successful directed self-assembly of block copolymers is realized when self-assembled on a neutral layer. This neutral layer matches (in characteristics) the directed self-assembly material to be applied on top of the neutral layer. Conventionally, there is no generic neutral layer that is compatible with multiple different block copolymer materials. Techniques disclosed herein include methods for creating a directed self-assembly tunable neutral layer that works with multiple different block copolymer materials. Techniques herein can include depositing a neutral layer and then post-processing this neutral layer to tune its characteristics so that the neutral layer is compatible with a particular block copolymer scheme or schemes. Post-processing herein of such a neutral layer can modify a ratio of pi and sigma bonds in a given carbon film or other film to approximate a given self-assembly film that will be deposited on this neutral layer.

Techniques herein include treating polymer-based films and other films to cause cross-linking reactions and/or other chemical reactions that produce a desired mixture or ratio of carbon-carbon single and double bonds. This resulting mixture or ratio adjusts a surface energy of a given film to a resulting surface energy that provides or enables a desired neutrality for a given block co-polymer system (from initial surface energy to modified surface energy). A degree of cross-linking can be tuned or controlled herein to yield a specific range and/or ratio of carbon-carbon sigma and pi bonds. This technique provides specific tuning of the surface energy as well as enabling the composition of the carbon-carbon sigma and pi bonds to be equivalent to what exists in a given fixed block co-polymer or other copolymer specified for use on a given substrate.

Accordingly, in example embodiments, a single spin-on neutral layer (single type of material) can be used for a given block co-polymer chemistry type by using a treatment process or chemical process that cross-links material of the spin-on neutral layer to produce a desired neutrality through surface energy modification or chemical compositional matching. Such modification can be executed on a same tool used for deposition of the tunable layer, which provides convenience and efficiency in various fabrication schemes. One of multiple different treatment techniques can be executed for surface energy modification. Example methods include in-situ exposure to 172 nm light, 248 nm light, and/or broad-band light. Light exposure can be executed with or without a thermal bake process. Such light exposure can be flood exposure or patterned exposure. Electron bombardment can also be used to generate sites on a given film that enable cross-linking or a change in material properties causing formation of carbon pi bonds within the film. Electron bombardment can be followed by a relatively thin sputtering of oxide or other material that further alters the surface energy of the film. The surface energy modification with the oxide or other sputtered material can be controlled on the nanometer scale which, for thin films, has significant influence on modified surface energy and other characteristics.

Figure 2:
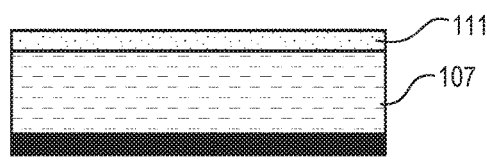
FIG. 2 is a cross-sectional schematic view of an example substrate segment showing a process flow according to embodiments disclosed herein.

One embodiment herein includes a method for patterning a substrate. FIG. 1 shows substrate 105 with underlying layer 107. Referring now to FIG. 2, the method comprises depositing a tunable layer 111 on substrate 105. The substrate 105 can optionally include a hardmask (patterned or continuous). An example substrate includes silicon wafers used in semiconductor manufacturing, flat panels, etc. The tunable layer 111 is an organic material having a first ratio of sigma bonds to pi bonds. This can include a random copolymer of a particular component composition. The tunable layer 111 can be deposited by spin-on deposition, chemical vapor deposition, etc. One example material for the tunable layer is polymethyl methacrylate. Optionally, the deposited tunable layer can be selected to be similar to that of a particular block co-polymer to be used (specified to be used) in a given directed self-assembly (DSA) patterning application. Another option is selecting deposited tunable films as a polymer based on, or having, a component composition similar to that of a particular component within a predetermined block co-polymer that contains a larger distribution of carbon sigma bonds. In some embodiments, the tunable layer can be deposited on a relief pattern.

A mixture ratio of a first block copolymer to a second block copolymer is identified that corresponds to a block copolymer mixture specified for deposition on the substrate. In other words, a given block copolymer material is desired to be used or specified to be used in a corresponding fabrication process. A mixture ratio of the material to be deposited is identified or otherwise retrieved, for example, either by measurement or reference to composition specifications.

The tunable layer 111 is then modified to result in a neutral layer. Such modification is executed by increasing the first ratio of sigma bonds to pi bonds to a second ratio of sigma bonds to pi bonds. This second ratio of sigma bonds to pi bonds has a value that is approximately equivalent to the mixture ratio of the first block copolymer to the second block copolymer. Thus, after a neutrality-tunable layer has been deposited or otherwise provided, one or more treatment techniques can be executed to modify properties (surface properties) of the tunable layer 111 to result in a neutral layer with desired properties. A selected treatment process changes a ratio of carbon sigma and pi bonds, for example, to match a ratio expressed by a predetermined block co-polymer. A given selected treatment process can alter a surface energy of the deposited film to be neutral to that of a selected block co-polymer to be applied subsequently, that is, to match a surface energy value of the selected block copolymer mixture. Sigma bonds can be carbon single bonds, while pi bonds are carbon double bonds. Such modification can increase a number of pi bonds in the tunable layer and/or increase a ratio of sigma bonds to pi bonds in the tunable layer.

Figures 3A, 3B:
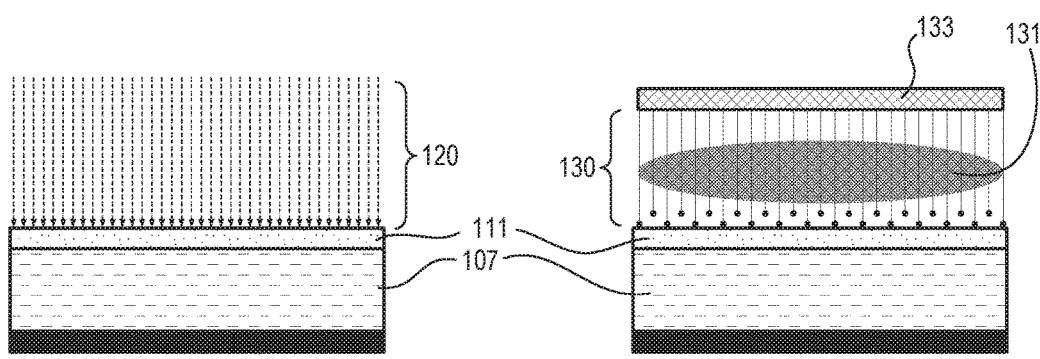
FIG. 3A is a cross-sectional schematic view of an example substrate segment showing light exposure according to embodiments disclosed herein.
FIG. 3B is a cross-sectional schematic view of an example substrate segment showing electron beam exposure according to embodiments disclosed herein.
Figures 3C, 3D:
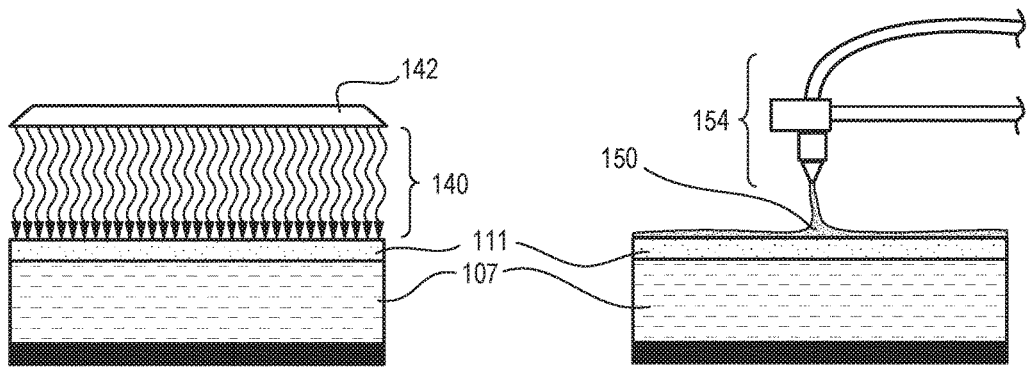
FIG. 3C is a cross-sectional schematic view of an example substrate segment showing heat treatment according to embodiments disclosed herein.
FIG. 3D is a cross-sectional schematic view of an example substrate segment showing acid deposition according to embodiments disclosed herein.

One or more different treatment techniques can be optionally used for surface energy modification. For example, cross-linking polymer films can be accomplished to produce carbon=carbon double bonds through exposure to DUV (deep ultraviolet) light (such as 172 nm wavelengths or 248 nm wavelengths). FIG. 3A shows substrate 105 being exposed to actinic radiation 120. The amount of exposure actinic radiation 130 can depend on material properties of the tunable layer 111, as well as a target amount of cross-linking to achieve. Thermal treatment can also be used. FIG. 3C illustrates tunable layer 111 receiving heat 140 from heat source 142, which can be infrared radiation. In this particular example, heat 140 is applied from above the substrate, but other embodiments can apply heat from below such as with a resistive heater within a chuck. Heat can also be applied in the presence of an acid in the polymer or generated acid in the polymer. Chemical modification can occur directly from thermal treatment or indirectly as acid is generated within a given deposited film. Thus, the tunable layer can include thermal acid generators that generate acid during a bake process. Parameters of the bake process can be precisely controlled to generate a specific amount of acid resulting in a specific surface energy change.

Figure 4:
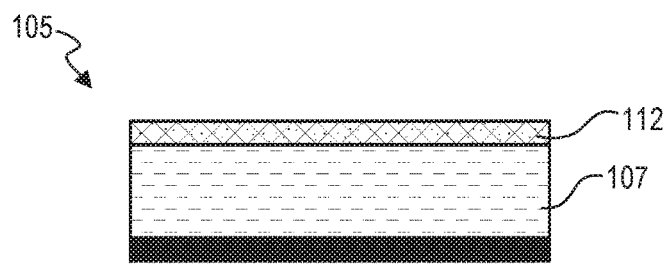
FIG. 4 is a cross-sectional schematic view of an example substrate segment showing a process flow according to embodiments disclosed herein.

Referring to FIG. 3B, cross-linking of a given polymer (tunable layer 111) can be executed by exposure to an electron beam 130. Such an electron beam 130 can be a flux of ballistic electrons or a patterned electron beam. Ballistic electrons can be generated by applying negative direct current voltage to upper electrode 133, which draws ions from plasma 131, collides with upper electrode 133, and results in secondary electron emission and sputtering of silicon. Referring now to FIG. 3D, surface energy modification of tunable layer 111 can also be executed by wet chemistry modification. Dispense apparatus 154 can deposit surface-energy changing agent 150. Surface-energy changing agent 150 can include acids, bases, solvents, etc., depending on a particular tunable layer. Surface energy modification can happen by virtue of the tunable layer being in contact with the surface-energy changing agent 150, or be a results of additional processing such as irradiation of the wet chemistry or baking subsequently to depositing a film of surface-energy changing agent 150 on the tunable layer 111. FIG. 4 shows that, after modification, tunable layer 111 has become neutral layer 112, which is then ready for continued processing.

Figure 5:
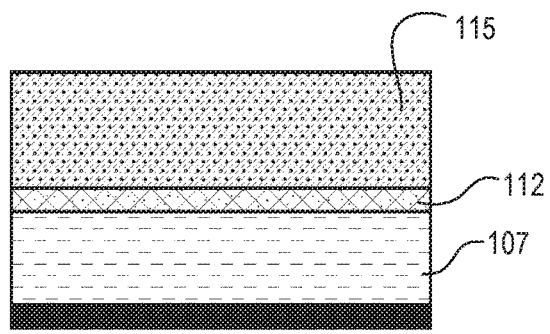
FIG. 5 is a cross-sectional schematic view of an example substrate segment showing a process flow according to embodiments disclosed herein.
Figure 6:
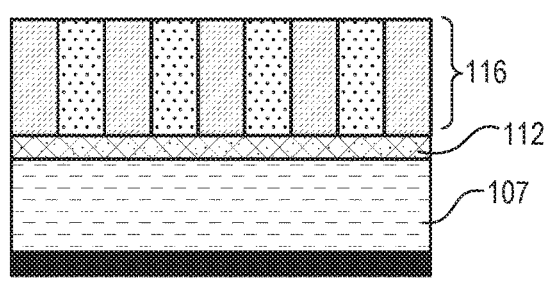
FIG. 6 is a cross-sectional schematic view of an example substrate segment showing a process flow according to embodiments disclosed herein.
Figure 7:
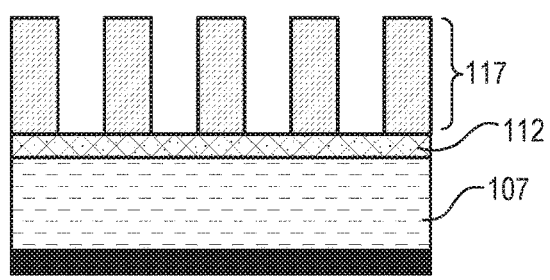
FIG. 7 is a cross-sectional schematic view of an example substrate segment showing a process flow according to embodiments disclosed herein.

In FIG. 5, a block copolymer mixture 115 is deposited on the substrate 105, which means being deposited on the neutral layer 112. Thus, after deposition and neutrality tuning of a given tunable layer, directed self-assembly of block copolymers can be executed by depositing the predetermined (corresponding) block copolymer mixture and then activating phase-separation. In FIG. 6, phase-separation of the block copolymer mixture is then caused such that self-assembly of the block copolymer mixture occurs. Phase-separation is typically initiated by heating or baking the substrate. This temperature increase causes the block copolymer to self-segregate. By self-segregating on the neutral layer 112, structures 116 are formed as vertically-oriented structures. In some embodiments, the second ratio of sigma bonds to pi bonds is selectively controlled to result in self-assembly of lines or self-assembly of cylinders from phase-separation of the block copolymer mixture. After formation of structures 116 of different materials, one of the materials can be selectively removed, such as by etching, to result in relief pattern 117 as shown in FIG. 7. Any number of additional processing steps can be subsequently executed. For example, a relief pattern can be formed from the tunable layer subsequent to modifying the tunable layer and prior to depositing the block copolymer mixture on the substrate. Such a technique can provide grapho epitaxial patterning.

Alternative embodiments are contemplated herein. Another method for patterning a substrate includes depositing a tunable layer on a substrate, the tunable layer being a material having a surface energy with a modification potential. A block copolymer mixture is identified that is specified for deposition on the substrate. The tunable layer is modified by changing an initial surface energy value of the tunable layer to a modified surface energy value. Modifying the tunable layer results in a neutral layer. This neutral layer has the modified surface energy value which enables vertically-oriented structures to self-assemble from the block copolymer mixture specified for deposition on the substrate. The block copolymer mixture is deposited on the substrate. Phase-separation of the block copolymer mixture is caused such that self-assembly of the block copolymer mixture occurs on the neutral layer forming vertically-oriented structures. Modifying the tunable layer can include executing a bond-changing surface treatment such as exposure to actinic radiation, thermal exposure, exposure to plasma products, acid deposition, or exposure to a flux of ballistic electrons.

In another embodiment a method for patterning a substrate includes receiving a substrate having a neutral layer positioned on one or more underlying layers. The neutral layer has an initial surface energy value. The neutral layer has been deposited by spin-on deposition or vapor deposition. A bond-changing surface treatment of the neutral layer is executed such that an initial ratio of carbon sigma to pi bonds is modified to result in a predetermined ratio of carbon sigma to pi bonds of the neutral layer. The bond-changing surface treatment results in a modified surface energy value of the neutral layer that is different from the initial surface energy value. The modified surface energy value corresponds to a specified surface energy value that enables directed self-assembly of vertical structures from a specific block copolymer mixture. Without a neutral layer directing self-assembly, it is possible for horizontal layers of polymers to form. The bond-changing surface treatment can include one or more treatments of exposure to electromagnetic radiation, thermal exposure, exposure to plasma products, acid deposition, exposure to a flux of ballistic electrons, and generating acid within the neutral layer.

One technique for modifying the neutral layer is flood exposure of a particular wavelength of light. Such radiation exposure can cross-link material in the neutral layer and/or increase a number of pi bonds within the film. Such a technique can modify the neutral layer (initial layer) to mimic a ratio of carbon double bonds to carbon single bonds within a DSA film to be subsequently deposited. Neutrality is a function of both surface tension and composition of a given material. By matching a neutral layer to a DSA material (block copolymer mixture) to be applied, the neutral layer can have an improved ability to guide or direct self-assembly.

In some embodiments the neutral layer (ready for DSA film deposition) can be comprised of random copolymers. Typically the neutral layer has both A and B components, but the components can be randomized. In other words, the neutral layer has the same composition as a block copolymer film to be self-assembled. This can include the same ratio of polymers. For example, in many applications, such as to create lines and spaces, a ratio of two given block copolymers is approximately equal. In other examples, such as to create cylinders and holes there may need to be much more of one material as compared to a second material, such as 70% to 30%. As such, a composition of a neutral layer needs to approximate or match the composition of a corresponding DSA layer.

Conventionally, neutral layer deposition is challenging because of the need to have multiple different mixtures available, and to clear out deposition lines and nozzles from a given deposition system prior to switching to a different type of neutral layer.

With techniques herein, an initial layer (tunable layer) is deposited that has all of one type material or one type of bond. Essentially a generic layer is deposited. This tunable layer is then treated, by way of a non-limiting example, with a flood exposure of 192 nm wavelength light. This exposure to a particular wavelength of light creates or increases the number of carbon double bonds. A particular block copolymer material to be self-assembled can phase-separate properly on such a modified neutral layer provided that the neutral layer has a similar ratio of carbon single and carbon double bonds. For example, to create lines and spaces, a given neutral layer can be modified to create an approximately even mix (50%-50%) of carbon single and carbon double bonds, that is, a preferred combination of pi bonds and sigma bonds. In other words, techniques herein can partially cross-link a given material so that a neutral layer can be wetting to both types of block copolymer material. By way of a non-limiting example, neutral layers can be on the order of 5 nm, while a block copolymer layer can be on the order of 30 nm.

Without having a neutral layer in place with desired surface energy, a given block copolymer mix can still phase separate (self-assemble), but a result would be an alternating pattern that alternates in a vertical direction, thereby forming multiple horizontal layers of material. Such a formation is typically unusable for many pattern transfer procedures in semiconductor manufacturing, albeit usable for other applications.

Note that modification of a tunable layer can be accomplished via various techniques. One technique includes light exposure using a 172 nm light source. Another technique includes negative direct current superposition that generates ballistic electrons that bombard the neutral layer, thereby causing cross-linking. Another technique can use a different source of electrons such as a scanning electron micrograph. In yet another embodiment, a functional group, such as a thermal acid generator, can be included with silicon chemistry when initially depositing the underlying 107 and/or the tunable layer 111. A heat treatment, such as by lamp or otherwise, can trigger release of acid within a layer thereby modifying carbon bonds. An amount of modification of carbon bonds can be dependent on how much acid is released, which release amount can be tuned by controlling an amount and/or duration of heat exposure.

The initially deposited tunable layer herein that is spun-on or deposited is not yet neutral to most block copolymer mixtures, but can be preferential to one block copolymer. For example, the tunable layer initially has only "A" type bonds. In other words, initially this tunable layer is preferentially wetting to only one block copolymer of a group of copolymers. Note that the tunable layer is initially not neutral to both materials but is preferentially wetting to one only. Thus a neutral layer can have a surface energy or wetting angle that functions for two or more block copolymers, Note that neutrality is not simply a function of surface energy, but surface energy can help with phase separation or defectivity performance.

After processing a tunable layer, a patterning layer or patterning treatment can be applied, which can be either grapho-epitaxial or chemo-epitaxy, and then directed self-assembly can continue with steps of depositing a block copolymer, causing phase separation, selective removal of one block copolymer, and then pattern transfer or continued patterning.

By following techniques herein, carbon double bonds can be created to increase or establish neutrality in the tunable layer. Bond ratios of 49/51 are common for block copolymer mixtures for forming lines and spaces, whereas ratios of around 70/30 are common for forming cylinders. A given ratio can also depend on a particular manufacturer of chemicals. For example, some compositions to form lines can have a 49/51 copolymer ratio, while another manufacturer may use a 48/52 ratio, while yet another manufacturer uses a 44/56 ratio composition in order to make the block copolymer.

Other embodiments include a flood exposure of the tunable layer to create a randomly distributed mix of bonds. Another technique includes a patterned exposure such as with an e-beam that changes selective portions of the tunable layer to neutral composition of bond ratios. Such a technique removes any etching step because modifying the tunable layer to become neutral generates a patterned neutral layer in that modified portions of the tunable layer define a self-assembly pattern in contrast to a random distribution of carbon bonds that form a neutral layer. Such a technique can use a mask-based pattern exposure system such as a photolithography system. In place of, or in addition to, a flood exposure treatment, a gas cluster ion beam (GCIB) can be used to convert an upper 1-2 nanometers of a CVD hardmask stack to have a surface energy tuned to be neutral for a particular block copolymer, In such a technique, there is no need to use an etch process to open the neutral layer prior to uncovering the underlying hardmask. In other words, directly modifying surface energy of a CVD film stack can remove a need for a neutral layer (separate neutral layer) entirely as the hardmask or memorization layer can function as a neutral layer.

Accordingly, processes herein enable a tunable neutral layer from a single starting material that can be tuned in terms of surface energy and chemical composition to exhibit neutral wetting to a given block co-polymer material. Currently each different DSA block co-polymer requires its own unique neutral layer, which means many chemical slots on a lithography track system are used to accommodate each different type of neutral layer. Using many different chemical modules to accommodate each neutral layer type needed increases an overall cost of ownership of a given processing system for incorporating a directed self-assembly processes in fabrication flows. By using a commodity film material or generic (default) film material as enabled herein, multiple different DSA schemes can be executed after one or more post-processing treatments. Thus, a single liquid chemistry spin-on system can be used, and one or more irradiation post-processing techniques can be used to fine tune the initial layer and/or create a given neutrality profile.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
   depositing a tunable layer on a substrate, the tunable layer being an organic material having a first ratio of sigma bonds to pi bonds;
   identifying a mixture ratio of a first block copolymer to a second block copolymer that corresponds to a block copolymer mixture specified for deposition on the substrate;
   modifying the tunable layer, to result in a neutral layer, by increasing the first ratio of sigma bonds to pi bonds to a second ratio of sigma bonds to pi bonds, the second ratio of sigma bonds to pi bonds having a value that is equivalent to the mixture ratio of the first block copolymer to the second block copolymer, the neutral layer being neutral to both the first block copolymer and the second block copolymer;
   depositing the block copolymer mixture on the substrate;
   causing phase-separation of the block copolymer mixture such that self-assembly of the block copolymer mixture occurs: and
   forming a relief pattern from the tunable layer subsequent to modifying the tunable layer and prior to depositing the block copolymer mixture on the substrate.

2. The method of claim 1, wherein modifying the tunable layer includes increasing a number of pi bonds in the tunable layer.

3. The method of claim 1, wherein modifying the tunable layer includes increasing cross-linking of the tunable layer by exposure to a flux of ballistic electrons or exposure to a patterned electron beam.

4. The method of claim 1, wherein modifying the tunable layer includes exposing the tunable layer to actinic radiation.

5. The method of claim 4, wherein exposing the tunable layer to actinic radiation includes exposing the tunable layer to light having a wavelength of 172 nanometers or 248 nanometers.

6. The method of claim 1, wherein the tunable layer includes thermal acid generators and wherein modifying the tunable layer includes executing a bake process that heats the tunable layer sufficient to generate acid from the thermal acid generators.

7. The method of claim 1, wherein the tunable layer comprises a polymethyl methacrylate film.

8. A method for patterning a substrate, the method comprising:
   depositing a tunable layer on a reief pattern on a substrate, the tunable layer being a material having a surface energy with a modification potential;
   identifying a block copolymer mixture specified for deposition on the substrate;
   modifying the tunable layer by changing an initial surface energy value of the tunable layer to a modified surface energy value, modifying the tunable layer resulting in a neutral layer, the neutral layer having the modified surface energy value, the neutral layer enabling vertically-oriented structures to self-assemble from the block copolymer mixture specified for deposition on the substrate, the neutral layer being neutral to both a first block copolymer and a second block copolymer of the block copolymer mixture;
   depositing the block copolymer mixture on the substrate; and
   causing phase-separation of the block copolymer mixture such that self-assembly of the block copolymer mixture occurs on the neutral layer forming vertically-oriented structures.

9. The method of claim 8, wherein modifying the tunable layer includes increasing a number of pi bonds in the tunable layer.

10. The method of claim 8, wherein modifying the tunable layer includes increasing cross-linking of the tunable layer by exposure to a flux of ballistic electrons or exposure to a patterned electron beam.

11. The method of claim 8, wherein modifying the tunable layer includes exposing the tunable layer to actinic radiation.

12. The method of claim 11, wherein exposing the tunable layer to actinic radiation includes exposing the tunable layer to light having a wavelength of 172 nanometers or 248 nanometers.

13. The method of claim 8, wherein the tunable layer includes thermal acid generators and wherein modifying the tunable layer includes executing a bake process that heats the tunable layer sufficient to generate acid from the thermal acid generators.

14. The method of claim 8, wherein the tunable layer comprises a polymethyl methacrylate film.

15. A method for patterning a substrate, the method comprising:
receiving a substrate having a tunable layer positioned on one or more underlying layers, the tunable layer having an initial surface energy value, wherein the tunable layer has been deposited by spin-on deposition or vapor deposition; and
executing a bond-changing surface treatment of the tunable layer such that an initial ratio of carbon sigma to pi bonds is modified to result in a neutral layer having a predetermined ratio of carbon sigma to pi bonds, the bond-changing surface treatment resulting in a modified surface energy value of the tunable layer that is different from the initial surface energy value, the modified surface energy value corresponding to a specified surface energy value that enables directed self-assembly of vertical structures from a specific block copolymer mixture, wherein the neutral layer is neutral to the specific block copolymer mixture.

16. The method of claim 15, wherein the bond-changing surface treatment is selected from the group consisting of exposure to electromagnetic radiation, thermal exposure, exposure to plasma products, acid deposition, and exposure to a flux of ballistic electrons.

17. The method of claim 15, wherein executing the bond-changing surface treatment generates acid within the neutral layer.

18. The method of claim 15, further comprising: subsequent to executing the bond-changing surface treatment, executing a patterning treatment that results in either a grapho-epitaxial or chemo-epitaxy pattern of the neutral layer.

* * * * *